(12) United States Patent
Yeh et al.

(10) Patent No.: US 8,864,560 B2
(45) Date of Patent: Oct. 21, 2014

(54) WATER-BLOCKING VENT PANEL AND AIR FILTER THEREFOR

(75) Inventors: Joseph Yeh, Plano, TX (US); Stephen Palaszewski, Chester, NJ (US); John L. LoSapio, Morris Plains, NJ (US)

(73) Assignee: CommScope, Inc. of North Carolina, Hickory, NC (US)

( * ) Notice: Subject to any disclaimer, the term of this patent is extended or adjusted under 35 U.S.C. 154(b) by 1655 days.

(21) Appl. No.: 12/233,633

(22) Filed: Sep. 19, 2008

(65) Prior Publication Data

US 2010/0015904 A1    Jan. 21, 2010

Related U.S. Application Data

(60) Provisional application No. 61/081,103, filed on Jul. 16, 2008.

(51) Int. Cl.
| | |
|---|---|
| *B01D 39/00* | (2006.01) |
| *B01D 46/00* | (2006.01) |
| *H05K 7/20* | (2006.01) |
| *B01D 46/10* | (2006.01) |
| *H05K 5/02* | (2006.01) |
| *H05K 5/00* | (2006.01) |

(52) U.S. Cl.
CPC ........ *H05K 7/20181* (2013.01); *B01D 46/0005* (2013.01); *B01D 46/10* (2013.01); *H05K 5/0213* (2013.01); *B01D 2265/024* (2013.01); *B01D 2279/45* (2013.01)
USPC ............... 454/184; 55/511; 55/490; 55/385.6

(58) Field of Classification Search
USPC .................. 454/184; 55/511, 490, 385.6, 428
See application file for complete search history.

(56) References Cited

U.S. PATENT DOCUMENTS

| | | | | |
|---|---|---|---|---|
| 786,203 | A | * | 3/1905 | Gailey .......................... 210/247 |
| 1,899,017 | A | * | 2/1933 | Dauphinee ................. 261/112.1 |

(Continued)

FOREIGN PATENT DOCUMENTS

| | | | | |
|---|---|---|---|---|
| JP | 2003227426 | A | * 8/2003 | ............ F02M 35/08 |
| WO | WO 2007/121811 | A1 | * 11/2007 | |
| WO | WO 2007121811 | A1 | * 11/2007 | |

OTHER PUBLICATIONS

Bretschneider et al, WO 2007/121811 A1, Nov. 1, 2007, English machine translation.*

(Continued)

*Primary Examiner* — Steven B McAllister
*Assistant Examiner* — Phillip E Decker
(74) *Attorney, Agent, or Firm* — Muncy, Geissler, Olds & Lowe, P.C.

(57) ABSTRACT

A housing includes a wall having an aperture and a vented panel, the vented panel including a first wall having a first side and a second side and an opening, a second wall having a first side, a second side facing the first wall first side and an opening, and a panel interior, the housing further including an air filter having an inner side and an outer side relative to the interior mounted against the second wall first side over the second wall opening with the filter inner side facing the housing interior, a water dam mounted along the filter bottom portion at the filter inner side, the water dam being higher than any water barrier mounted along the filter bottom portion outer side, whereby, any water reaching the filter bottom is substantially prevented from draining into the housing interior. Also an air filter usable in the housing.

19 Claims, 3 Drawing Sheets

(56) References Cited

U.S. PATENT DOCUMENTS

| | | | |
|---|---|---|---|
| 3,232,438 A * | 2/1966 | Pashaian et al. | 210/534 |
| 3,418,794 A * | 12/1968 | Roberts | 55/501 |
| 3,880,626 A * | 4/1975 | Griwatz et al. | 55/485 |
| 3,907,057 A * | 9/1975 | Reddekopp | 180/89.2 |
| 4,017,282 A * | 4/1977 | Zahka et al. | 55/428 |
| 4,334,899 A * | 6/1982 | McConnell | 55/321 |
| 4,557,095 A * | 12/1985 | Rice et al. | 52/473 |
| 4,582,601 A * | 4/1986 | Strow et al. | 210/161 |
| 5,201,879 A * | 4/1993 | Steele | 454/184 |
| 5,297,004 A * | 3/1994 | Mazura | 361/690 |
| 5,454,756 A * | 10/1995 | Ludwig | 454/296 |
| 5,573,562 A * | 11/1996 | Schauwecker et al. | 55/385.4 |
| 5,690,719 A * | 11/1997 | Hodge | 96/17 |
| 5,886,296 A * | 3/1999 | Ghorbani et al. | 174/50 |
| 5,922,096 A * | 7/1999 | Stemmer | 55/483 |
| 6,036,755 A * | 3/2000 | Weng | 96/223 |
| 6,104,003 A | 8/2000 | Jones | |
| 6,105,875 A | 8/2000 | LaGrotta | |
| 6,127,663 A | 10/2000 | Jones | |
| 6,361,578 B1 * | 3/2002 | Rubinson | 55/487 |
| 6,368,374 B1 * | 4/2002 | Tokar et al. | 55/498 |
| 6,390,173 B1 * | 5/2002 | Story, Jr. | 160/371 |
| 6,464,745 B2 * | 10/2002 | Rivera et al. | 55/497 |
| 6,599,344 B2 * | 7/2003 | Tokar et al. | 55/510 |
| 6,623,540 B2 | 9/2003 | Clayton et al. | |
| 6,751,479 B1 | 6/2004 | Knight | |
| 6,776,706 B2 * | 8/2004 | Kipka et al. | 454/184 |
| 6,793,703 B1 * | 9/2004 | Sledge et al. | 55/495 |
| 6,846,342 B2 * | 1/2005 | Mertz et al. | 55/486 |
| 6,878,175 B2 * | 4/2005 | Keller et al. | 55/320 |
| 7,425,274 B1 * | 9/2008 | Helfet | 210/807 |
| 7,455,706 B2 * | 11/2008 | Latham et al. | 55/385.1 |
| 7,789,928 B2 * | 9/2010 | Stepp | 55/495 |
| 7,974,094 B2 * | 7/2011 | Hendrix et al. | 361/695 |
| 2007/0251381 A1 * | 11/2007 | Latham et al. | 95/23 |
| 2007/0289273 A1 * | 12/2007 | Boyd | 55/497 |
| 2007/0294988 A1 * | 12/2007 | Miller et al. | 55/495 |
| 2008/0212286 A1 * | 9/2008 | Komatsu | 361/714 |
| 2008/0222932 A1 * | 9/2008 | Yun et al. | 40/541 |
| 2008/0257160 A1 * | 10/2008 | Yoshida et al. | 96/139 |
| 2009/0185348 A1 * | 7/2009 | Bretschneider et al. | 361/695 |
| 2009/0241454 A1 * | 10/2009 | Yeh et al. | 52/473 |
| 2009/0260906 A1 * | 10/2009 | Hartland et al. | 180/68.3 |
| 2010/0011531 A1 * | 1/2010 | Liddell et al. | 15/347 |
| 2010/0313757 A1 * | 12/2010 | Crabtree et al. | 55/385.6 |
| 2010/0313760 A1 * | 12/2010 | Crabtree et al. | 55/385.6 |
| 2011/0048228 A1 * | 3/2011 | Handley et al. | 95/45 |
| 2012/0048115 A1 * | 3/2012 | Crabtree et al. | 95/273 |

OTHER PUBLICATIONS

Rudick, et al, Door Operated Pump Assembly for REmoving Air or Water from an Enclosed Space in a Temperature-Controlled System, Feb. 17, 2004, IPCOM000021951D.*

Bretschneider et al, WO 2007121811 A1 English machine translation, Nov. 2007.*

Definition of "Against", Oxford English Dictionary, Oxford University Press, 2014.*

* cited by examiner

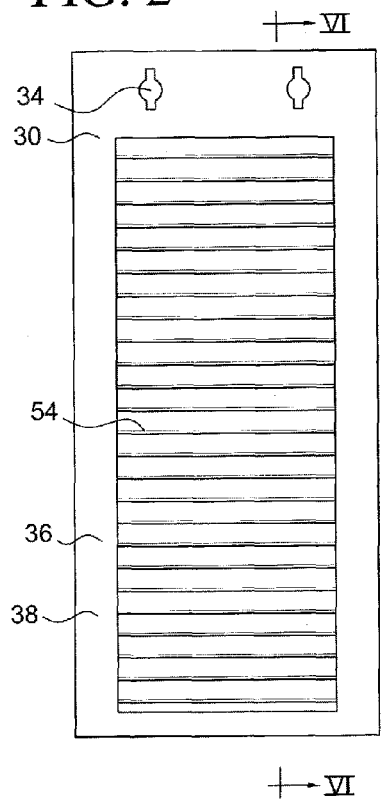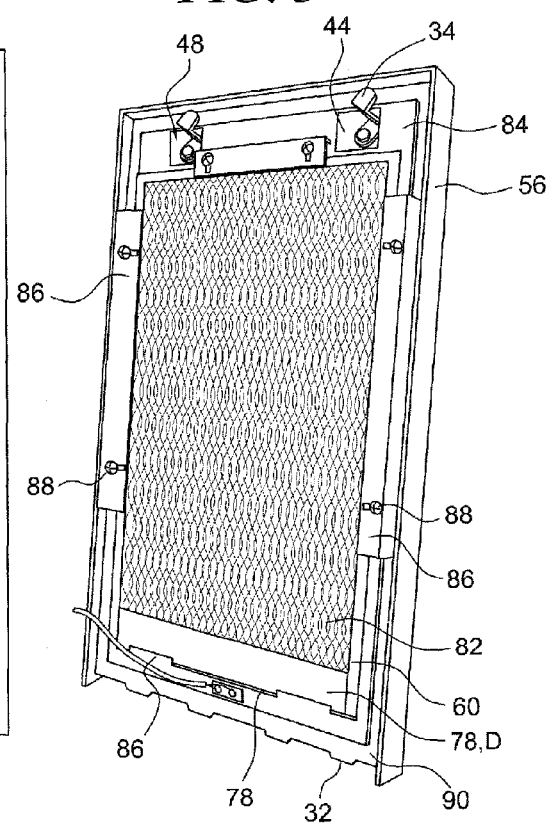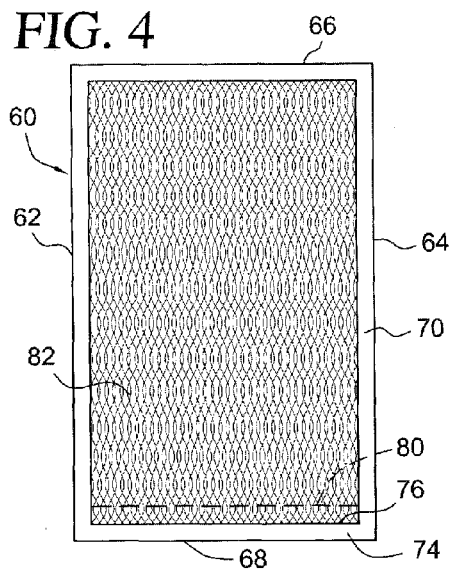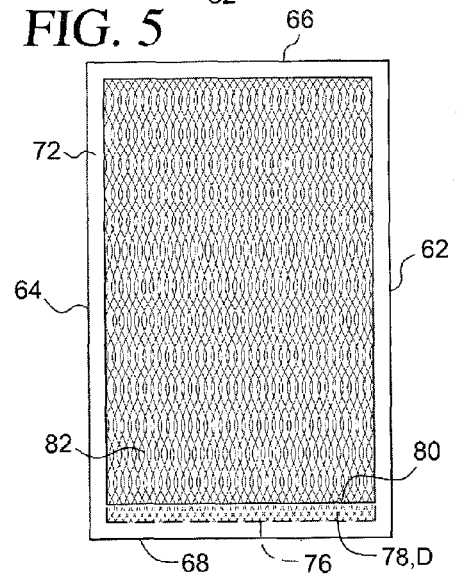

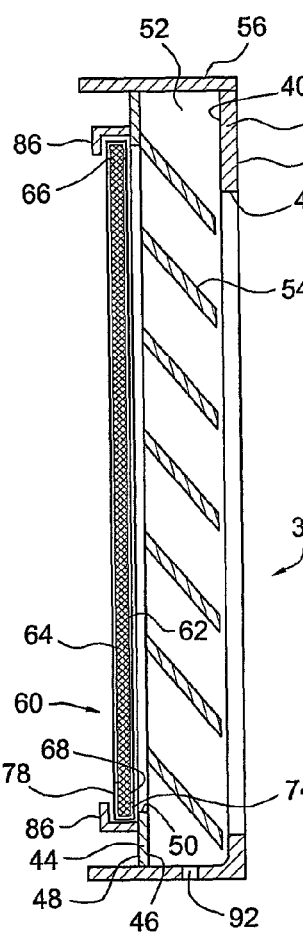
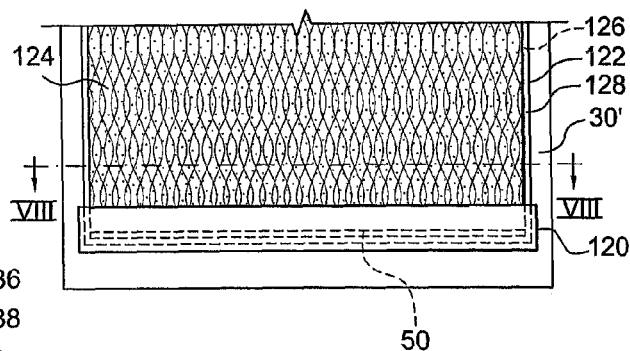
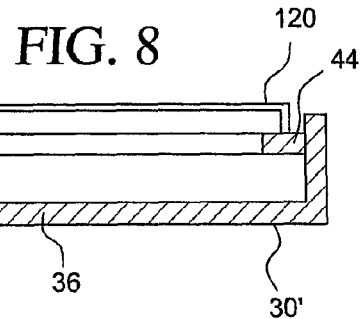
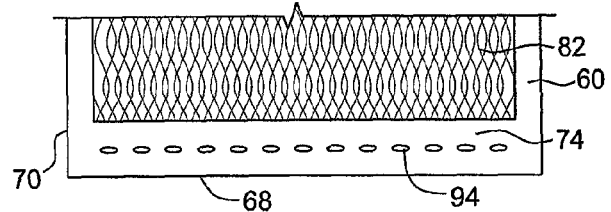
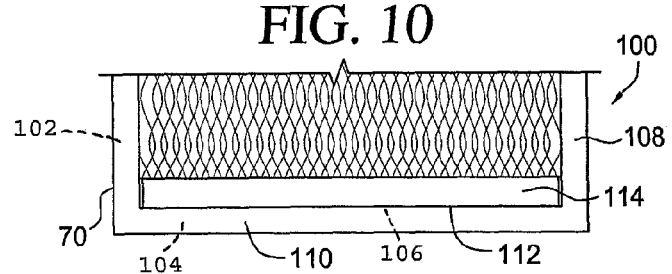

WATER-BLOCKING VENT PANEL AND AIR FILTER THEREFOR

CROSS-REFERENCE TO RELATED APPLICATIONS

The present invention claims the benefit of U.S. Provisional Patent Application No. 61/081,103, filed Jul. 16, 2008, the entire contents of which is hereby incorporated by reference.

FIELD OF THE INVENTION

The present invention is directed toward a vented panel and to a filter configured to reduce water passage through the vented panel, and more specifically, toward a vented panel and a filter configured to drain any water accumulating in a bottom portion of the filter in a given direction.

BACKGROUND OF THE INVENTION

Outdoor cabinets for housing telecommunication and/or electrical equipment are known, which cabinets may include vents for allowing air into or out of the housing to cool the equipment contained therein. Many cabinets include an access opening covered by a door or panel, and it is known to provide ventilation openings, sometimes partially covered by a plurality of louvers, in the panel. Other times, ventilation openings are provided in one of the walls of the cabinet.

It is generally desirable to design such cabinets to protect against water entry because water may damage or interfere with the proper operation of the enclosed equipment. Also, depending on the outdoor temperature and the amount of heat generated by the equipment in the cabinet, it may be desirable to provide a relatively high airflow into the cabinet to provide a desired level of cooling. It also may sometimes be desirable to provide an air filter to reduce the amount of dust and particulate matter that is drawn into the housing.

It can be difficult to keep out dust and moisture while maintaining a suitably high air flow. For example, small or constricted ventilation openings can be used to reduce water entry into the cabinet, but such openings may also adversely affect air flow into the cabinet and/or may be expensive to manufacture. Larger openings that provide higher air flow may allow an undesirably large amount of water into the cabinet. Air filters, on the other hand, tend to reduce air flow and may also absorb or collect water which may then find its way into the interior of the cabinet. It would therefore be desirable to provide a vented panel for an outdoor cabinet that allows adequate airflow into the cabinet while substantially reducing the passage of moisture and particulate matter into the cabinet.

SUMMARY OF THE INVENTION

These problems and others are addressed by the present invention, a first aspect of which comprises an air filter having a bottom, a first side, a second side and a front and a rear relative to a first direction of intended air flow through the filter. The filter further includes a front frame having a bottom wall member having a first thickness in the first direction, a first length between the first and second sides of the air filter and a first width perpendicular to the first length and perpendicular to the first thickness. In addition, the filter includes a rear frame having a bottom wall member having a second thickness in the first direction and a second length between the first and second sides of the air filter and a second width perpendicular to the second length and the second thickness. A layer of filter material is supported between the front frame member and rear frame member, and the front frame and rear frame are configured such that water accumulating at the filter bottom is substantially prevented from flowing over or through the rear frame bottom wall member.

Another aspect of the invention comprises a housing having an interior, a wall having an aperture, and a vented panel mounted over the aperture. The vented panel includes a first wall having a first side and a second side and an opening, a second wall having a first side, a second side facing the first wall first side, and an opening, and a panel interior between the first wall first side and the second wall second side. The housing also includes a filter having an inner side and an outer side relative to the interior mounted against the second wall first side over the second wall opening with the filter inner side facing the housing interior for filtering air passing through the second wall opening into the housing interior. The filter also has a bottom end and a bottom portion adjacent the bottom end. A water dam is mounted along the filter bottom portion at the filter inner side, the water dam being higher than any water barrier mounted along the filter bottom portion outer side so any water reaching the filter bottom is substantially prevented from draining into the housing interior.

A further aspect of the invention comprises a vented housing having an interior having a bottom and including a wall having an inner side facing the interior and at least one ventilation opening in the wall. The housing also includes a filter mounted against the wall inner side over the ventilation opening for filtering air passing through the at least one ventilation opening and into the housing interior. The filter has a bottom end facing the housing bottom, a bottom portion adjacent the bottom end, an inner side facing into the housing interior and an outer side facing the at least one opening. A water dam is mounted along the inner side of the filter bottom portion, the water dam being higher than any water barrier mounted along the filter outer side bottom portion, so that any water reaching the filter bottom is substantially prevented from entering the housing interior.

BRIEF DESCRIPTION OF THE DRAWINGS

These and other aspects and features of embodiments of the present invention will be better understood after a reading of the following detailed description, together with the attached drawings, wherein:

FIG. 2 is a front elevational view of the ventilation panel of FIG. 1;

FIG. 3 is a rear perspective view of the ventilation panel of FIG. 1;

FIG. 4 is front elevational view of an embodiment of a filter mountable in a ventilation panel of an embodiment of the present invention;

FIG. 5 is a rear elevational view of the filter of FIG. 4;

FIG. 6 is a sectional side elevational view taken in the direction of line V-V in FIG. 2;

FIG. 7 is an elevational view of a portion of a ventilation panel according to another embodiment of the present invention;

FIG. 8 is a sectional plan view taken in the direction of line VIII-VIII in FIG. 7;

FIG. 9 is an elevational view of a portion of another embodiment of a filter mountable in a ventilation panel according to an embodiment of the present invention;

FIG. 10 is an elevational view of a portion of another embodiment of a filter mountable in a ventilation panel according to an embodiment of the present invention.

DETAILED DESCRIPTION

Figure 1:
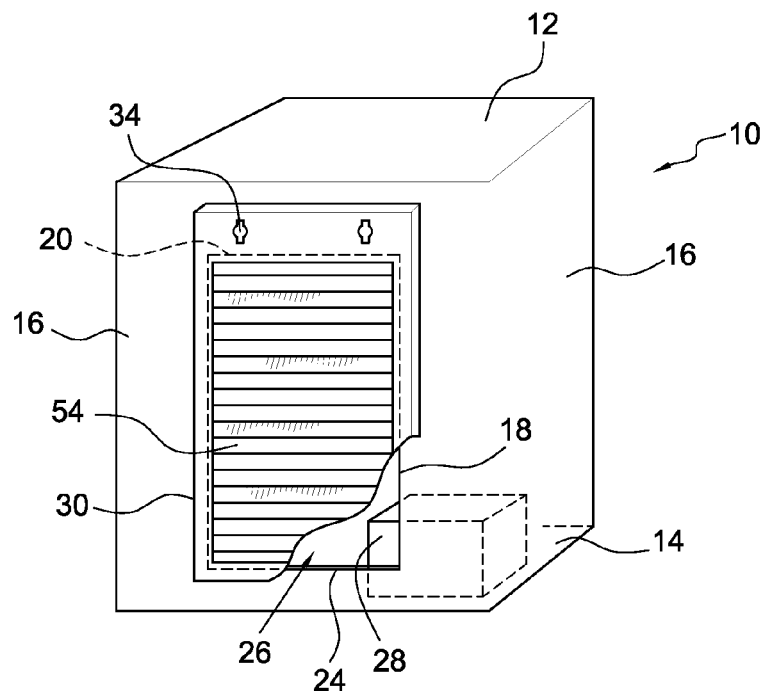
FIG. 1 is a perspective view of an outdoor cabinet on which a ventilation panel according to an embodiment of the present invention is mounted.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

Referring now to the drawings, FIG. 1 illustrates a housing or cabinet 10 having a top 12, a bottom 14 and a plurality of sides 16, one of which sides 16 includes an opening 18 having a top edge 20 and a bottom edge 24 that allows access to the interior 26 of the housing 10 and to any equipment 28 contained therein. A vented panel 30, illustrated in FIGS. 2 and 3, is mounted over opening 18 to allow selective access to the interior 26. Vented panel 30 includes one or more flanges 32 projecting from a bottom edge thereof and first and second latches 34 projecting through the panel 30 near an upper edge thereof which flanges 32 fit over bottom edge 24 of opening 18 and which latches 34 selectively engage top edge 20 of opening 18. In a first orientation, latches 34 secure panel 30 over opening 18, and in a second orientation, the latches 34 release the panel 30 from the housing 10 to allow access to interior 26.

FIG. 6 illustrates an outer wall 36 of panel 30 ("outer" relative to interior 26 of housing 10 or another housing on which panel 30 may be mounted) which outer wall 36 includes a first side 38 and a second side 40 (illustrated in FIG. 5) and an opening 42 therein, an inner wall 44 (facing interior 26 of housing 10) having a first side 46 facing the second side 40 of the outer wall 36, a second side 48 and an opening 50 therein aligned generally with the opening 42 in outer wall 36. The inner wall 44 and the outer wall 36 define between them a panel interior 52. A plurality of overlapping louvers 54 extend laterally across the openings 42 and 50 of the outer wall 36 and inner wall 44 between the outer wall 36 and inner wall 44. Panel side walls 56 connect panel outer wall 36 and panel inner wall 44 and partially define panel interior 52.

FIGS. 4 and 5 illustrate a filter 60 having a first side 62, a second side 64, a top 66 and a bottom 68 which filter 60 further comprises a front frame 70, illustrated in FIG. 4, and a rear frame 72 illustrated in FIG. 5. "Front" and "rear" are used herein relative to an intended direction of air flow through the filter so that air will enter the filter from the front and exit the filter at the rear. Front frame 70 includes a bottom wall member 74 having an inner edge 76 and a length extending generally between the first and second sides 62, 64 of the filter 60, a thickness in the direction of air flow through the filter 60 and a width between the filter bottom 68 and the front frame bottom wall member inner edge 76. Rear frame 72 includes a bottom wall member 78 having an inner edge 80 and a length extending generally between the first and second sides 62, 64 of the filter 60, a thickness in the direction of air flow through the filter 60 and a width between filter bottom 68 and rear frame bottom wall member inner edge 80. As will be apparent from a comparison of FIGS. 4 and 5, the width of rear frame bottom wall member 78 is greater than the width of front frame bottom wall member 74; that is, the distance between the filter bottom 68 and rear frame bottom wall member inner edge 80 is greater than the distance between filter bottom 68 and front frame bottom wall member inner edge 76. The filter will normally be mounted with bottom 68 facing the ground; therefore, rear frame bottom wall member 78 may be described herein as being "higher" or "taller" than front frame bottom wall member 74. A sheet of filter material 82 is connected between filter front frame 70 and filter rear frame 80 which may comprise, for example, a matrix of metallic wires or fibers for trapping particulate matter. Preferably, the filter material 82 is of a type adapted for blocking water passage therethrough. A suitable filter material is available from The Filter Factory of Carpinteria, Calif., under the trade name MISTX.

A gasket 84 is mounted around opening 50 in inner wall 44 to provide a water-tight seal with filter 60 when filter 60 is connected to panel 30. As illustrated in FIG. 3, filter 60 is secured to panel 30 with a plurality of brackets 86 releasably attachable to inner wall 44 of panel 30 each of which brackets 86 overlies a portion of the rear frame 72 of filter 60. To install filter 60 in panel 30, filter 60 is placed over opening 50 in inner wall 44 against gasket 84, and brackets 86 are placed such that they overlie part of the rear frame 72 of filter 60. A plurality of fasteners, such as screws 88, secure brackets 86 to inner wall 44, and as screws 88 are tightened, front frame 70 of filter 60 is pressed against gasket 84 to form a seal therewith. Alternate arrangements for securing filter 60 against inner wall 44 could be used without exceeding the scope of this invention. To install panel 30 on housing 10, flanges 32 of panel 30 are placed over bottom edge 24 of opening 18 in housing side 16, and panel 30 is pivoted about the bottom edge 24 until latches 34 enter opening 18. The latches 34 are then rotated to engage behind the top edge 20 of opening 18 and secure the panel to the housing. A suitable gasket 90 may also be provided on inner wall 44 to form a watertight seal between the panel 30 and the housing 10 when the panel 30 is installed on the housing.

In use, air passes freely through louvers 54 in vented panel 30 to cool equipment 28 in housing 10. Louvers 54 overlap so that there is no straight line path from the outside of housing 10 to the interior 26 of housing 10 through the louvers. This configuration, coupled with the downward slope of the louvers helps reduce water passage into the housing 10. Substantially all water droplets, mist, or spray that does pass through louvers 54, droplets driven by high wind, for example, are blocked by filter 60 and drip or run down through the filter material 82 to the bottom of the filter 60. Any water arriving at the bottom 68 of filter 60 preferentially flows over the bottom wall member 74 of front frame 70 rather than over the bottom wall member 78 of frame rear 72 because of the height difference between the front and rear frame bottom wall members 74, 78. Rear frame bottom wall member 78 thus forms a water dam D for blocking water flow into the interior 56 of housing 10. Water from the bottom 68 of filter 60 thus drains into the interior 52 of panel 30 and drains out of the panel through drain openings 92 in the bottom of one of panel side walls 56 as illustrated in FIG. 6.

Other configurations of filter 60 also form a water dam D to drain water preferentially from the filter material 82 away from the interior of the housing and/or into the interior 52 of vented panel 30. For example, as illustrated in FIG. 9, a plurality of drain openings 94 may be provided in bottom wall member 74 of front frame member 70 at a level sufficiently spaced from the bottom 68 of filter 60 so that water will drain over the bottom edge of opening 50 and into the panel interior 52 when filter 60 is mounted over opening 50. When such drain openings 94 are provided, the height of front frame bottom wall member 74 may be the same as the height of rear frame bottom wall member 78, or the front frame bottom wall member 74 may remain lower than rear frame bottom wall member 78 to provide an overflow pathway in the event that drain openings 94 become blocked or cannot drain water from the filter 60 quickly enough.

A second filter 100 usable with vented panel 30 is illustrated in FIG. 10. Filter 100 includes a front frame 102 having a bottom wall member 104 having an inner edge 106 and a rear frame 108 having a bottom wall member 110 having an inner edge 112. Filter 100 further includes an extension panel 114 connected to rear frame 108 adjacent rear frame bottom wall member 110 in a manner that forms a watertight seal with rear frame bottom wall member 110 and the side of filter 100. The extension panel 114, may, for example, be riveted to the sides of the filter 100, and any gaps between the extension panel 114 and the rear frame 108 may be filled with a suitable waterproof sealant (not illustrated). In this manner, the extension panel 114 forms with the rear frame bottom wall member 110 a water dam D that is higher than the front frame bottom wall member 104 so that water will preferentially drain through front frame 102. In this manner, conventional air filters that do not have a water dam D on a rear frame thereof can be modified to include a water dam D to provide benefits of the present invention.

In a further embodiment of the invention, a water dam D is provided separately from a filter. FIGS. 7 and 8 illustrate a vented panel 30' similar to vented panel 30 but including a pocket 120 as described herein. Elements identical to those of vented panel 30 discussed above are identified with the same reference numerals and are not described in detail. Pocket 120 is formed at the bottom of opening 50 in inner wall 44 and is configured to receive a filter 122. The filter is then secured against gasket 84 using brackets 86 as discussed above. Filter 122 includes a layer of water-blocking filter material 124 between a front frame 126 and a rear frame 128. If water accumulates at the bottom of filter 122, pocket 120 will form a water dam D and substantially prevent the water from flowing into the interior 56 of housing 10 and will force it instead to flow over front frame 126 and through opening 50 in inner wall 44 and into the interior of panel 30'. Vented panel 30' can thus be used with filters that do not have the above described water dam feature and provide similar benefits.

Figure 11:
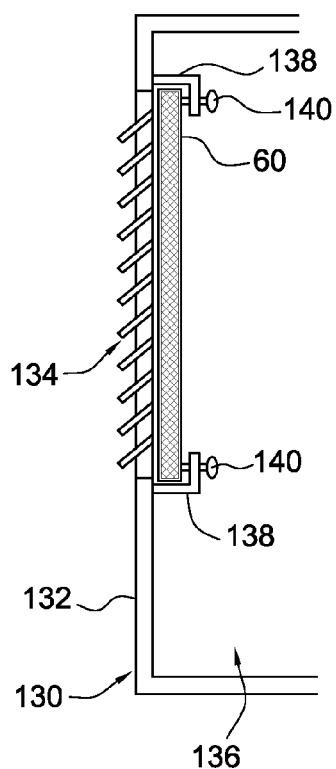
FIG. 11 is a sectional side elevational view of a filter mounted in a vented housing according to another embodiment of the present invention.

A further embodiment of the present invention is illustrated in FIG. 11 which illustrates a housing 130 having a plurality of side walls 132, one of which has vents 134 formed therein to allow air into the interior 136 of the housing. Brackets 138 are mounted around the periphery of vents 134 into which a filter 60 or 100 may be slid. Fasteners, such as bolts 140, are threaded through openings in brackets 138 and can be tightened after the filter 60, 100 is installed in the brackets 86 to hold the filter 60, 100 against the housing 130. The water dam D formed by the higher rear frame bottom wall member 78 of filter 60 or the filter extension 114 of filter 100, substantially prevents water reaching the bottom of a filter 60 or 100 from entering the interior 136 of the housing and instead causes it to flow over the inner edge 76 of front frame 72 or inner edge 106 of front frame 102 and out one of vents 134.

The present invention has been described herein in terms of several preferred embodiments. However, modifications and additions to these embodiments will become apparent to those of ordinary skill in the art upon a reading of the foregoing description. It is intended that all such modifications and additions comprise a part of the present invention to the extent that they fall within the scope of the several claims appended hereto.

What is claimed is:

1. A housing (10) having a housing interior (26), the housing comprising:
a wall (16) having an aperture (18); and a vented panel (30, 30') mounted over the aperture, the vented panel including:
  a first wall (36, 126) having a first wall first side (38) and a first wall second side (40) and a first wall opening (42);
  a second wall (44, 128) having a second wall first side (46), a second wall second side (48), and having a second wall opening (50), the second wall first side (46) facing the first wall second side (40);
  a panel interior (52) between the first wall second side (40) and the second wall first side (46);
  a water dam attached to said second wall second side (48), wherein said water dam extends across a bottom of said second wall opening (50), wherein said water dam is configured with a surface facing and spaced from an area of said second wall second side (48) terminating under said second wall opening (50) to form a pocket (120);
  a filter (60, 100, 122) having a filter inner side and a filter outer side relative to the housing interior (26) mounted against the second wall second side (44) over the second wall opening (50) with the filter inner side facing the housing interior (26) for filtering air passing through the second wall opening (50) into the housing interior (26), the filter (60, 100, 122) having a filter bottom end (68) and a filter bottom portion adjacent the filter bottom end (68), wherein said filter bottom end (68) and at least a portion of said filter bottom portion are positioned in said pocket (120),
  wherein a water dam top edge is higher than a bottom of said second wall opening (50) such that water reaching the filter bottom portion of the filter (60, 100, 122) is substantially prevented from draining into the housing interior (26), and
  wherein said pocket (120) formed by said water dam and said area of said second wall second side (44) under said second wall opening (50) is configured to receive said bottom end (68) of said filter (60, 100, 120).

2. The housing (10) of claim 1 wherein said filter (60, 100, 122) includes a front frame (70) having a bottom wall member (74) and a rear frame (72) having a bottom wall member (78) and wherein said front frame bottom wall member (74) comprises a water barrier (76) lower than said water dam.

3. The housing (10) of claim 2, wherein water barrier (76) of said front frame bottom wall member (74) is lower than said water dam such that the water preferentially flows over the front frame bottom wall member (74) rather than the water dam.

4. The housing (10) of claim 3, wherein the second wall opening (50) is aligned with the first wall opening (42).

5. The housing (10) of claim 1 wherein said water dam is attached to said filter (60, 100, 122).

6. The housing of claim 1 wherein at least a portion of the surface of said water dam facing and spaced from an area of said second wall second side (44) under said opening (50) to form said pocket contacts a surface of the filter inner side.

7. The housing (10) of claim 5 wherein said filter (60, 100, 122) includes a front frame (70) overlying the filter outer side, and rear frame (72) overlying the filter inner side and a layer of filter material (82) supported between the front frame (70) and the rear frame (72), another water dam comprising an extension of the rear frame portion (72).

8. The housing (10) of claim 7 wherein said filter rear frame (72) comprises a water barrier (78) mounted along a bottom portion of the rear frame (72).

9. The housing (10) of claim 1 wherein said panel interior (52) has a drain opening (92) and wherein said filter outer side faces into said panel interior (52).

10. The housing (10) of claim 1 wherein said vented panel (30, 30') further comprises a plurality of overlapping louvers (54) extending across the second wall opening (50).

11. The housing (10) of claim 1, wherein the second wall opening (50) is aligned with the first wall opening (42).

12. The housing (10) of claim 11 wherein said vented panel (30, 30') comprises a plurality of overlapping louvers (54) arranged within the panel interior (52) and extending across the first wall opening (42) and the second wall opening (50).

13. The housing (10) of claim 12, wherein the louvers (54) are secured to the second wall (44, 128).

14. The housing (10) of claim 1, wherein an area of the filter outer side contacts a surface of the second wall second side (48).

15. A vented housing (10) having housing interior (26) having a bottom (14) and including a wall (30, 30') having wall inner side (48) facing the housing interior (26) and an outer side (38) forming an exterior surface of the vented housing (10), and at least one ventilation opening (50, 42) in the wall (30, 30'), the housing (10) further including:
  a water dam attached to said inner side (48) of said wall (30, 30'), wherein said water dam extends across a bottom of said at least one ventilation opening (50, 42), wherein said water dam is configured with a surface facing and spaced from an area of said wall inner side (48) of said wall (30, 30') terminating below said at least one ventilation opening (50, 42) to form a pocket (120);
  a filter (60, 100, 122) mounted against the wall inner side (48) over the ventilation opening (50, 42) for filtering air passing from outside the exterior surface through the at least one ventilation opening (50, 42) and into the housing interior (26), the filter (60, 100, 122) having a filter bottom end (68) facing the housing bottom, a filter bottom portion adjacent the filter bottom end (68), a filter inner side facing into the housing interior (26) and a filter outer side facing the at least one ventilation opening (50, 42),
  wherein a top edge of said water dam is higher than the bottom of said at least one ventilation opening (50, 42) of said wall (30, 30') such that water reaching the filter bottom portion of the filter is substantially prevented from entering the housing interior, and
  wherein said pocket (120) formed by said water dam and said area of said inner side (48) of said wall (30, 30') under said at least one ventilation opening (50, 42) is configured to receive said filter bottom end (68).

16. The vented housing (10) of claim 15 wherein said filter (60, 100, 122) includes a rear frame (72) and a front frame (70) and wherein the water dam is higher than the front frame (70) such that water reaching the filter bottom drains over or through said front frame (70).

17. The vented housing (10) of claim 15 wherein said at least one ventilation opening (50, 42) includes a plurality of overlapping louvers (54).

18. The vented housing (10) of claim 15 wherein said filter (60, 100, 122) includes a rear frame (72) and a front frame (70) and wherein the water dam is higher than the front frame (70) such that water reaching the filter bottom preferentially drains over the front frame (70).

19. The vented housing (10) of claim 15, wherein an area of the filter outer side contacts a surface of the inner side (48 of said wall (30, 30').

* * * * *